(12) United States Patent
Kim et al.

(10) Patent No.: US 9,113,534 B2
(45) Date of Patent: Aug. 18, 2015

(54) LIGHT-EMITTING CONTROL CIRCUIT, LIGHT-EMITTING CONTROL METHOD AND SHIFT REGISTER

(71) Applicant: BOE TECHNOLOGY GROUP CO., LTD., Beijing (CN)

(72) Inventors: Tae Gyu Kim, Beijing (CN); Pil Seok Kim, Beijing (CN); Ying Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/126,640

(22) PCT Filed: Nov. 21, 2012

(86) PCT No.: PCT/CN2012/084973
§ 371 (c)(1),
(2) Date: Dec. 16, 2013

(87) PCT Pub. No.: WO2014/008732
PCT Pub. Date: Jan. 16, 2014

(65) Prior Publication Data
US 2014/0285108 A1  Sep. 25, 2014

(30) Foreign Application Priority Data
Jul. 13, 2013 (CN) .......................... 2012 1 0244368

(51) Int. Cl.
*H05B 33/08* (2006.01)
*G09G 3/32* (2006.01)
*G11C 19/18* (2006.01)

(52) U.S. Cl.
CPC .......... *H05B 33/0896* (2013.01); *G09G 3/3266* (2013.01); *G11C 19/184* (2013.01); *G09G 2300/0861* (2013.01); *G09G 2310/0286* (2013.01)

(58) Field of Classification Search
USPC ................................ 315/291, 299, 302, 307
See application file for complete search history.

(56) References Cited

U.S. PATENT DOCUMENTS

| 8,121,244 B2 | 2/2012 | Kim |
| 2007/0063933 A1 | 3/2007 | Chung |
| 2011/0012765 A1* | 1/2011 | Hsieh et al. .................. 341/143 |

FOREIGN PATENT DOCUMENTS

| CN | 101697284 A | 4/2010 |
| CN | 101765876 A | 6/2010 |

(Continued)

OTHER PUBLICATIONS

First Office action (Chinese language) issued by the State Intellectual Property Office ("SIPO") on Feb. 28, 2914 for application No. 2012102443683.3, 8 pages.

(Continued)

*Primary Examiner* — Daniel D Chang

(57) ABSTRACT

A light-emitting control circuit, a light-emitting control method and a shift register. The light-emitting control circuit comprises an inputting terminal (Input), an input sampling unit (11), an outputting unit (12), a resetting unit (13), an output pulling-down unit (14) and an outputting terminal for a light-emitting control signal (EM[n]). The input sampling unit (11) samples an input signal under a control of a first clock signal (CK1); the outputting unit (12) generates a light-emitting control signal under a control of a second clock signal (CK2) after the input sampling unit (11) samples the input signal; the resetting unit (13) resets the light-emitting control signal through the output pulling-down unit (14) under a control of a third clock signal (13). An OLED device is in an OFF state during a process for writing display data into pixel cells and the OLED device is turned on to emit light after the display data is written into the pixel cells, thus a display image is guaranteed not to generate flickers due to an unstable state of a pixel circuit as the data is written.

20 Claims, 4 Drawing Sheets

(56) References Cited

FOREIGN PATENT DOCUMENTS

| CN | 102201194 A | 9/2011 |
|----|-------------|--------|
| CN | 102760406 A | 10/2012 |
| CN | 202650492 U | 1/2013 |
| EP | 2474969 A1 | 7/2012 |
| TW | 200951937 A | 12/2009 |

OTHER PUBLICATIONS

English translation of first Office action for application No. 201210244368.3, 8 pages.

Second Office action (Chinese language) issued by the State Intellectual Property Office ("SIPO") f on Sep. 25, 2014 for application No. 201210244368.3. 5 pages.

English translation of second Office action for application No. 201210244368.3, 3 pages.

English abstract of CN102201194A, 1 page.
English abstract of CN101697284A, 1 page.
English abstract of TW200951937A, 2 pages.
English abstract of CN102760406A, 1 page.
English abstract of CN202650492U, 1 page.
English abstract of CN101765876A, 2 pages.

* cited by examiner

LIGHT-EMITTING CONTROL CIRCUIT, LIGHT-EMITTING CONTROL METHOD AND SHIFT REGISTER

CROSS REFERENCE TO RELATED APPLICATIONS

This application is based on International Application No. PCT/CN2012/084973 filed on Nov. 21, 2012, which claims priority to Chinese National Application No. 201210244368.3 filed on Jul. 13, 2012, the contents of which are incorporated herein by reference.

TECHNICAL FIELD

The present disclosure relates to a field of organic light-emitting display, and in particular to a light-emitting control circuit, a light-emitting control method and a shift register.

BACKGROUND

An Organic Light-Emitting Diode (OLED) has been applied to displays with a high performance more and more because of its advantages such as a high luminance, a wide viewing angle, a rapid response speed and etc. Traditional passive matrix OLED (PMOLED) requires shorter driving time for a single pixel as its display size becomes bigger, therefore an instantaneous current is increased and a power consumption is also increased. Further, an application with a big current would cause a voltage drop on an ITO line too great and an operation voltage at the OLED too high, which may decrease its efficiency in turn. As compared, an active matrix OLED (AMOLED) may solve these problem well by scanning input OLED currents progressively with switching transistors.

For an AMOLED (Active Matrix Organic Light Emitting Diode) display, not only a row strobing signal for controlling an ON/OFF state of a pixel connected with a gate is required to be generated, but also an ON/OFF state of the organic light emitting diode (OLED) is required to be controlled. A state controlling signal for the OLED is a positive level signal with respect to an AMOLED display backboard composed of p-type transistors, in order to ensure that an OLED device is in the OFF state during a process for writing display data into pixel cells and the OLED device is turned on to emit light after the display data is written into the pixel cells, thereby a display image is guaranteed not to generate flickers due to an unstable state of a pixel circuit as the data is written.

SUMMARY

A major object of embodiments of the present disclosure is to provide a light-emitting control circuit, a light-emitting control method and a shift register, which may be capable of ensuring that an OLED device is in an OFF state during a process for writing display data into pixel cells and the OLED device is turned on to emit light after the display data is written into the pixel cells, thus a display image is guaranteed not to generate flickers due to a unstable state of a pixel circuit as the data is written.

In order to achieve the above objects, the embodiments of the present disclosure provide a light-emitting control circuit for generating a light-emitting control signal which controls an OLED to emit light in an AMOLED, phases of the light-emitting control signal and a gate driving signal are opposite;

the light-emitting control circuit comprises an inputting terminal, an input sampling unit, an outputting unit, a resetting unit, an output pulling-down unit and an outputting terminal for a light-emitting control signal, wherein, the output pulling-down unit is connected with the outputting terminal for the light-emitting control signal;

the input sampling unit is connected with the inputting terminal, a first clock signal inputting terminal and the output pulling-down unit, respectively, and is used for sampling an input signal under a control of a first clock signal and transmitting the sampled signal to the outputting terminal for the light-emitting control signal through the output pulling-down unit;

the outputting unit is connected with the input sampling unit, a second clock signal inputting terminal and the outputting terminal for the light-emitting control signal, respectively, and is used for generating a light-emitting control signal under a control of a second clock signal after the input sampling unit samples the input signal and transmitting the light-emitting control signal to the outputting terminal for the light-emitting control signal;

the resetting unit is connected with a third clock signal inputting terminal and the output pulling-down unit, respectively, and is used for sending a resetting control signal to the output pulling-down unit under a control of a third clock signal;

the output pulling-down unit is used for resetting the light-emitting control signal according to the resetting control signal.

According to the embodiments of the present disclosure, the input sampling unit comprises a first thin film transistor and a second thin film transistor;

a gate of the first thin film transistor is connected with the first clock signal inputting terminal, a source thereof is connected with the outputting unit, and a drain thereof is connected with the inputting terminal;

a gate of the second thin film transistor is connected with the first clock signal inputting terminal, a source thereof is connected with the outputting unit, and a drain thereof is connected with a low level outputting terminal of a driving power supply.

According to the embodiments of the present disclosure, the outputting unit comprises a third thin film transistor, a fourth thin film transistor, a fifth thin film transistor, a sixth thin film transistor, a seventh thin film transistor, a first capacitor and a second capacitor;

a gate of the third thin film transistor is connected with the source of the first thin film transistor, a source thereof is connected with a gate of the fourth thin film transistor, and a drain thereof is connected with the second clock signal inputting terminal;

the gate of the fourth thin film transistor is connected with the source of the third thin film transistor, a source thereof is connected with a gate of the sixth thin film transistor, and a drain thereof is connected with the low level outputting terminal of the driving power supply;

a gate of the fifth thin film transistor is connected with the second clock signal inputting terminal, a source thereof is connected with a high level outputting terminal of the driving power supply, and a drain thereof is connected with the source of the second thin film transistor;

the source of the sixth thin film transistor is connected with the high level outputting terminal of the driving power supply, and a drain thereof is connected with a source of a twelfth thin film transistor;

a gate of the seventh thin film transistor is connected with the second clock signal inputting terminal, a source thereof is connected with the high level outputting terminal of the driving power supply, and a drain thereof is connected with a source of a thirteenth thin film transistor;

the first capacitor is connected between the gate and source of the third thin film transistor;

the second capacitor is connected between the gate of the sixth thin film transistor and the low level outputting terminal of the driving power supply.

According to the embodiments of the present disclosure, the resetting unit comprises an eighth thin film transistor and a ninth thin film transistor;

a gate of the eighth thin film transistor is connected with the third clock signal inputting terminal, a source thereof is connected with the high level outputting terminal of the driving power supply, and a drain thereof is connected with the source of the first thin film transistor;

a gate of the ninth thin film transistor is connected with the third clock signal inputting terminal, a source thereof is connected with the source of the second thin film transistor, and a drain thereof is connected with the low level outputting terminal of the driving power supply.

According to the embodiments of the present disclosure, the output pulling-down unit comprises a tenth thin film transistor, an eleventh thin film transistor, the twelfth thin film transistor, the thirteenth thin film transistor, a third capacitor, a fourth capacitor, a fifth capacitor and a sixth capacitor;

a gate of the tenth thin film transistor is connected with a gate of the eleventh thin film transistor, a source thereof is connected with the high level outputting terminal of the driving power supply, and a drain thereof is connected with the source of the third thin film transistor;

a source of the eleventh thin film transistor is connected with the high level outputting terminal of the driving power supply, and a drain thereof is connected with the source of the fourth thin film transistor;

a gate of the twelfth thin film transistor is connected with the source of the second thin film transistor, the source thereof is connected with the drain of the sixth thin film transistor, and a drain thereof is connected with the low level outputting terminal of the driving power supply;

a gate of the thirteenth thin film transistor is connected with the gate of the tenth thin film transistor, a source thereof is connected with the outputting terminal for the light-emitting control signal, and a drain thereof is connected with the low level outputting terminal of the driving power supply;

the third capacitor is connected between the gate and source of the twelfth thin film transistor;

the fourth capacitor is connected the gate and source of the thirteenth thin film transistor;

the fifth capacitor is connected between the gate of the tenth thin film transistor and the low level outputting terminal of the driving power supply;

the sixth capacitor is connected between the outputting terminal for the light-emitting control signal and the low level outputting terminal of the driving power supply.

The light-emitting control circuit according to the embodiments of the present disclosure further comprises an opposite phase outputting terminal;

the gate of the forth thin film transistor is connected with the opposite phase outputting terminal;

a signal output from the opposite phase outputting terminal has an opposite phase to the light-emitting control signal.

According to the embodiments of the present disclosure, the first thin film transistor, the second thin film transistor, the third thin film transistor, the fourth thin film transistor, the fifth thin film transistor, the sixth thin film transistor, the seventh thin film transistor, the eighth thin film transistor, the ninth thin film transistor, the tenth thin film transistor, the eleventh thin film transistor, the twelfth thin film transistor and the thirteenth thin film transistor are p-type TFTs.

The embodiments of the present disclosure further provide a light-emitting control method applied to the light-emitting control circuit, for generating a light-emitting control signal which controls an OLED to emit light in an AMOLED, phases of the light-emitting control signal and a gate driving signal is opposite;

the light-emitting control method comprises steps of:

an input sampling step in which a input sampling unit samples an input signal under a control of a first clock signal and transmits the sampled signal to a outputting terminal for the light-emitting control signal through the output pulling-down unit;

an outputting step in which an outputting unit generates a light-emitting control signal under a control of a second clock signal after the input sampling unit samples the input signal and transmitting the light-emitting control signal to the outputting terminal for the light-emitting control signal;

a resetting step in which a resetting unit resets the light-emitting control signal through the output pulling-down unit under a control of a third clock signal.

The embodiments of the present disclosure further provide a shift register comprising a plurality of light-emitting control circuit stages described above;

except for the first light-emitting control circuit stage and the second light-emitting control circuit stage, an input signal of the nth light-emitting control circuit stage is a signal having an phase opposite to a light-emitting control signal from a (n-2)th light-emitting control circuit stage;

an input signal of the first light-emitting control circuit stage and an input signal of the second light-emitting control circuit stage are a start signal;

n is an integer being greater than 2 and smaller than or equal to N, the N is a number of stages of the light-emitting control circuits included in the shift register.

As compared with the prior art, the light-emitting control circuit, the light-emitting control method and the shift register according to the embodiments of the present disclosure generate the light-emitting control signal having the phase opposite to that of the gate driving signal, so that the OLED device is in the OFF state during the process for writing display data into pixel cells and the OLED device is turned on to light after the display data is written into the pixel cells, thus a display image is guaranteed not to generate flickers due to an unstable state of a pixel circuit as the data is written.

DETAILED DESCRIPTION

Objects, solutions and advantages of the present disclosure will be more apparent from the following detailed description for the embodiments of the present disclosure taken in conjunction with the accompanying drawings. Herein, the exemplary embodiments of the present disclosure and their description aim to only illustrate the present disclosure but not to limit the present disclosure.

For an Active Matrix Liquid Crystal Display (AMLCD), a gate driving circuit is used for generating a row strobing control signal for a pixel circuit array. However, for an Active Matrix Organic Light Emitting Diode (AMOLED) display, an OLED is a device driven by a current, therefore a light emitting of an OLED device may be controlled by control a path through which the current flows into the OLED. Thus, the embodiments of the present disclosure provide a light-emitting control circuit, a light-emitting control method and a shift register in order to control the light emitting of the OLED in the AMOLED display accurately.

The light-emitting control circuit according to the embodiments of the present disclosure cooperates with a conventional gate driving circuit, and may achieve respective controls to operation states of the OLED and the pixel circuit.

Figure 1:
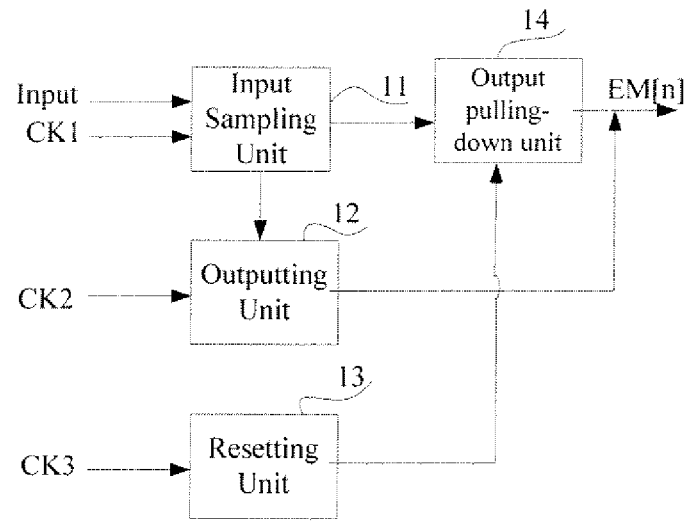
FIG. 1 is a circuit diagram illustrating a light-emitting control circuit according to a first embodiment of the present disclosure.

As illustrated in FIG. 1, a light-emitting control circuit according to a first embodiment of the present disclosure is used for generating a light-emitting control signal which controls an OLED to emit light in an AMOLED, phases of the light-emitting control signal and a gate driving signal are opposite;

the light-emitting control circuit comprises an inputting terminal INPUT, an input sampling unit 11, an outputting unit 12, a resetting unit 13, an output pulling-down unit 14 and an outputting terminal EM[n] for a light-emitting control signal, wherein, the input sampling unit 11 is connected with the inputting terminal INPUT, the outputting unit 12, a first clock signal inputting terminal and the output pulling-down unit 14, respectively, and is used for sampling an input signal under a control of a first clock signal and transmitting the sampled signal to the outputting terminal EM[n] for the light-emitting control signal through the output pulling-down unit 14;

the outputting unit 12 is connected with the input sampling unit 11, a second clock signal inputting terminal and the outputting terminal EM[n] for the light-emitting control signal, respectively, and is used for generating a light-emitting control signal under a control of a second clock signal after the input sampling unit 11 samples the input signal and transmitting the light-emitting control signal to the outputting terminal EM[n] for the light-emitting control signal;

the resetting unit 13 is connected with a third clock signal inputting terminal and the output pulling-down unit 14, respectively, and is used for sending a resetting control signal to the output pulling-down unit under a control of a third clock signal;

the output pulling-down unit 14 is connected with the outputting terminal EM[n] for the light-emitting control signal, and is used for resetting the light-emitting control signal under a control of the resetting control signal;

the first clock signal CK1 is input from the first clock signal inputting terminal, the second clock signal CK2 is input from the second clock signal inputting terminal, and the third clock signal CK3 is input from the third clock signal inputting terminal.

The light-emitting control circuit according to the first embodiment of the present disclosure may generate the light-emitting control signal which controls the OLED to emit light in the AMOLED, wherein the light-emitting control signal has an opposite phase to that of the gate driving signal. Such light-emitting control circuit may control the light-emitting of the OLED accurately in the AMOLED display, so that the OLED device is in an OFF state during a process for writing display data into pixel cells and the OLED device is turned on to emit light after the display data is written into the pixel cells, thus a display image is guaranteed not to generate flickers due to an unstable state of a pixel circuit as the data is written.

Figure 2:
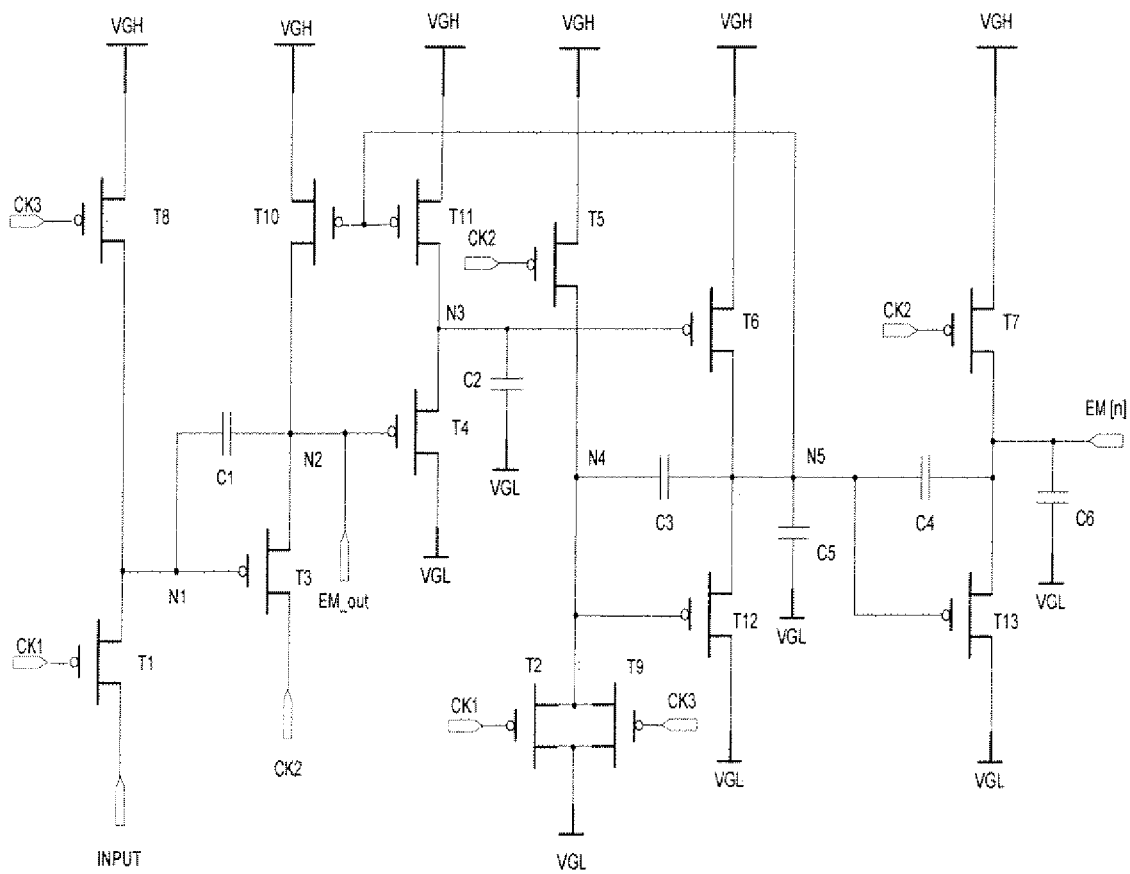
FIG. 2 is a circuit diagram illustrating a light-emitting control circuit according to a second embodiment of the present disclosure.

FIG. 2 is a circuit diagram illustrating a light-emitting control circuit according to a second embodiment of the present disclosure. As illustrated in FIG. 2, the light-emitting control circuit according to the second embodiment of the present disclosure is based on the light-emitting control circuit according to the first embodiment of the present disclosure. In the light-emitting control circuit according to the second embodiment of the present disclosure:

the input sampling unit comprises a first thin film transistor T1 and a second thin film transistor T2;

the outputting unit comprises a third thin film transistor T3, a fourth thin film transistor T4, a fifth thin film transistor T5, a sixth thin film transistor T6, a seventh thin film transistor T7, a first capacitor C1 and a second capacitor C2;

the resetting unit comprises an eighth thin film transistor T8 and a ninth thin film transistor T9;

the output pulling-down unit comprises a tenth thin film transistor T10, an eleventh thin film transistor T11, the twelfth thin film transistor T12, the thirteenth thin film transistor T13, a third capacitor C3, a fourth capacitor C4, a fifth capacitor C5 and a sixth capacitor C6;

a gate of the first thin film transistor T1 is connected with the first clock signal inputting terminal, a source thereof is connected with a gate of the third thin film transistor T3, and a drain thereof is connected with the inputting terminal INPUT;

a gate of the second thin film transistor T2 is connected with the first clock signal inputting terminal, a source thereof is connected with a drain of the fifth thin film transistor T5, and a drain thereof is connected with a low level outputting terminal of a driving power supply;

a source of the third thin film transistor T3 is connected with a gate of the fourth thin film transistor T4, and a drain thereof is connected with the second clock signal inputting terminal;

a source of the fourth thin film transistor T4 is connected with a gate of the sixth thin film transistor T6, and a drain thereof is connected with the low level outputting terminal of the driving power supply;

a gate of the fifth thin film transistor T5 is connected with the second clock signal inputting terminal, and a source thereof is connected with a high level outputting terminal of the driving power supply;

the source of the sixth thin film transistor T6 is connected with the high level outputting terminal of the driving power supply, and a drain thereof is connected with a source of the twelfth thin film transistor T12;

a gate of the seventh thin film transistor T7 is connected with the second clock signal inputting terminal, a source thereof is connected with the high level outputting terminal of the driving power supply, and a drain thereof is connected with a source of the thirteenth thin film transistor T13;

a gate of the eighth thin film transistor T8 is connected with the third clock signal inputting terminal, a source thereof is connected with the high level outputting terminal of the driving power supply, and a drain thereof is connected with the source of the first thin film transistor T1;

a gate of the ninth thin film transistor T9 is connected with the third clock signal inputting terminal, a source thereof is connected with the source of the second thin film transistor T2, and a drain thereof is connected with the low level outputting terminal of the driving power supply;

a gate of the tenth thin film transistor T10 is connected with a gate of the eleventh thin film transistor T11, a source thereof is connected with the high level outputting terminal of the driving power supply, and a drain thereof is connected with the source of the third thin film transistor T3;

a source of the eleventh thin film transistor T11 is connected with the high level outputting terminal of the driving power supply, and a drain thereof is connected with the source of the fourth thin film transistor T4;

a gate of the twelfth thin film transistor T12 is connected with the source of the second thin film transistor T2, the source thereof is connected with the drain of the sixth thin film transistor T6, and a drain thereof is connected with the low level outputting terminal of the driving power supply;

a gate of the thirteenth thin film transistor T13 is connected with the gate of the tenth thin film transistor T10, a source thereof is connected with the outputting terminal EM[n] for the light-emitting control signal, and a drain thereof is connected with the low level outputting terminal of the driving power supply;

the first capacitor C1 is connected between the gate and source of the third thin film transistor T3;

the second capacitor C2 is connected between the gate of the sixth thin film transistor T6 and the low level outputting terminal of the driving power supply the third capacitor C3 is connected between the gate and source of the twelfth thin film transistor T12;

the fourth capacitor C4 is connected the gate and source of the thirteenth thin film transistor T13;

the fifth capacitor C5 is connected between the gate of the tenth thin film transistor T10 and the low level outputting terminal of the driving power supply;

the sixth capacitor C6 is connected between the outputting terminal EM[n] for the light-emitting control signal and the low level outputting terminal of the driving power supply;

the first clock signal CK1 is input from the first clock signal inputting terminal, the second clock signal CK2 is input from the second clock signal inputting terminal, and the third clock signal CK3 is input from the third clock signal inputting terminal;

an output voltage from the high level outputting terminal of the driving power supply is VGH, and an output voltage from the low level outputting terminal of the driving power supply is VGL;

a N1 node is a node with which the gate of the third thin film transistor T3 is connected;

a N2 node is a node with which the gate of the fourth thin film transistor T4 is connected;

a N3 node is a node with which the gate of the sixth thin film transistor T6 is connected;

a N4 node is a node with which the gate of the twelfth thin film transistor T12 is connected;

a N5 node is a node with which the gate of the thirteenth thin film transistor T13 is connected;

the N2 node (that is, an opposite phase outputting terminal EM_out) is connected with the next shift register unit stage in order to provide an input signal for the next shift register unit stage;

a signal output from the opposite phase outputting terminal EM_out has an opposite phase to that of a light-emitting control signal;

wherein the C1, C3 and C4 are bootstrap capacitors, the C2, C4 and C6 are storage capacitors; the bootstrap capacitor is mostly used to pull up or pull down a level at a node, while the storage capacitor is mostly used to remain the level at the node.

The first thin film transistor T1, the second thin film transistor T1, the third thin film transistor T3, the fourth thin film transistor T4, the fifth thin film transistor T5, the sixth thin film transistor T6, the seventh thin film transistor T7, the eighth thin film transistor T8, the ninth thin film transistor T9, the tenth thin film transistor T10, the eleventh thin film transistor T11, the twelfth thin film transistor T12 and the thirteenth thin film transistor T13 are p-type TFTs.

Figure 3:
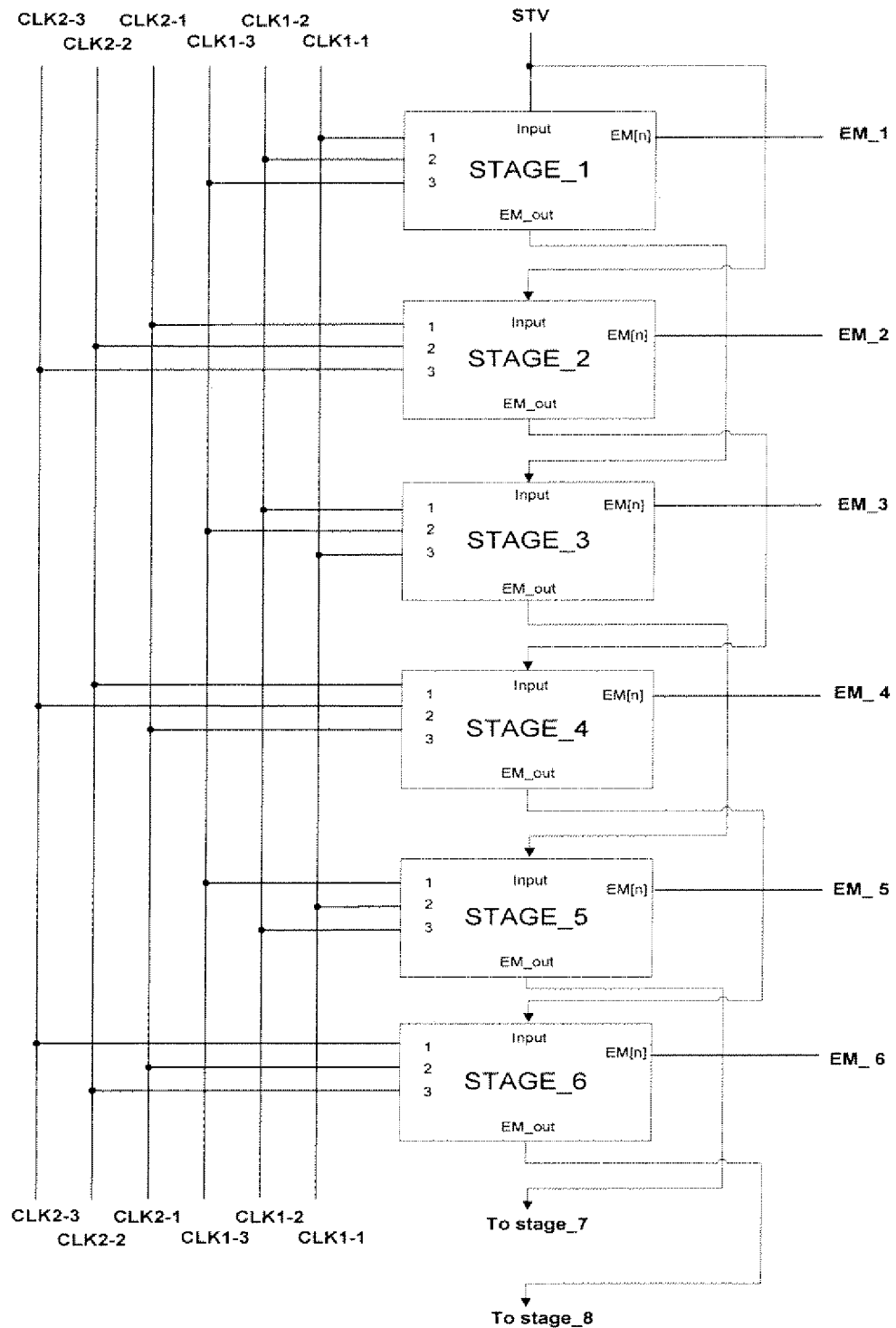
FIG. 3 is a circuit diagram illustrating a shift register according to an embodiment of the present disclosure.

As illustrated in FIG. 3, a shift register according to an embodiment of the present disclosure comprises a plurality of the light-emitting control circuit stages according to the second embodiment of the present disclosure;

except for the first light-emitting control circuit stage and the second light-emitting control circuit stage, an inputting terminal Input of the nth light-emitting control circuit stage is connected with an opposite phase outputting terminal EM_out of a (n-2)th light-emitting control circuit stage;

an inputting terminal Input of the first light-emitting control circuit stage and an inputting terminal Input of the second light-emitting control circuit stage are connected with a start signal inputting terminal;

a start signal STV is input from the start signal inputting terminal;

n is an integer being greater than 2 and smaller than or equal to N, the N is a number of stages of the light-emitting control circuits included in the shift register.

In FIG. 3, STAGE_1, STAGE_2, STAGE_3, STAGE_4, STAGE_5, STAGE_6, STAGE_7 and STAGE_8 denote the first light-emitting control circuit stage, the second light-emitting control circuit stage, the third light-emitting control circuit, the fourth light-emitting control circuit stage, the fifth light-emitting control circuit stage, the sixth light-emitting control circuit stage, the seventh light-emitting control circuit and the eighth light-emitting control circuit stage, respectively.

Also, the first clock signal, the second clock signal and the third clock signal connected with an odd light-emitting control circuit stage are CLK1-1, CLK1-2 and CLK1-3, respectively;

the first clock signal, the second clock signal and the third clock signal connected with an even light-emitting control circuit stage are CLK2-1, CLK2-2 and CLK2-3, respectively.

Figure 4:
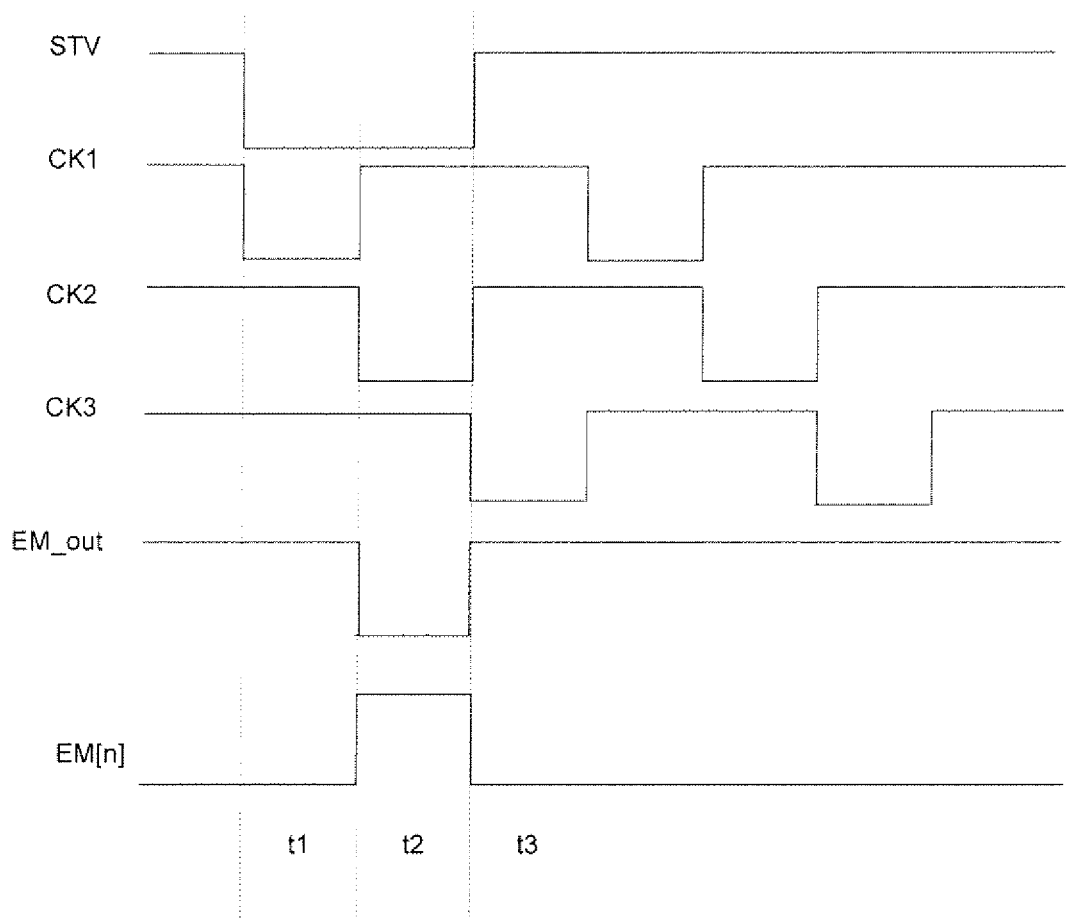
FIG. 4 is a view illustrating an operation timing of the light-emitting control circuit according to the second embodiment of the present disclosure.

FIG. 4 is a view illustrating an operation timing of the light-emitting control circuit according to the second embodiment of the present disclosure, wherein the light-emitting control circuit is the first light-emitting control circuit stage in the shift register.

A pulse width of the STV is twice as a pulse width of the CK1, a pulse width of the CK2 and a pulse width of the CK3.

A first falling edge of the CK1 aligns with a falling edge of the STV;

a first falling edge of the CK2 aligns with a first rising edge of the CK1;

a first falling edge of the CK3 aligns with a rising edge of the STV;

a duty ratios of the CK1, the CK2 and the CK3 are ⅓.

As illustrated in FIG. 4, a t1 stage is an input sampling stage. At this time, the input signal STV is also in the low level, and the CK1 is in the low level at this moment so the T1 is turned on, the CK3 is in the high level so the T8 is turned off, then the level at the N1 node is pulled down to VGL+|Vthp|; at the same time, the T2 is turned on because the CK1 is in the low level, the N4 node is in the low level, the T12 is turned on, the N5 node is in the low level. Thus, on the one hand, the T10 and T11 are turned on, the N2 node and the N3 node are in the high level, and because the transistors T4 and T6 are turned off, the levels at the N3 node and the N5 node are ensured; on the other hand, the T13 is turned on, so the light-emitting control signal output from the outputting terminal EM[n] for the light-emitting control signal is in the low level; wherein Vthp is a threshold voltage of a p-type thin film transistor.

A t2 stage is an outputting stage. The CK1 and CK3 are in the high level, the transistors T1, T3, T2 and T9 are all turned off, the level at the N1 node is pulled down correspondingly because of the bootstrap effect of the capacitor C1; the T3 is turned on, the CK2 signal is in the low level, the level at the N2 node is low at this time, then the T4 is turned on to pull down the level at the N3 node; accordingly, the T6 is turned on, the N5 node is in the high level and the T13 is turned off; the T7 is turned on since the CK2 is in the low level, so the light-emitting control signal output from the outputting terminal EM[n] for the light-emitting control signal is a high level signal and provides a ON signal to the OLED device.

A t3 stage is a resetting stage. The CK3 is low, the T8 and T9 are turned on accordingly to pull up the level at the N1 node and pull down the level at the N4 node. At this time, the T12 is turned on, the level at the N5 node is in the low level. At this moment, the T10 and T11 are turned on so as to pull up the levels at the N2 node and the N3 node. The T4 and T6 are turned off so that the levels at the N3 node and the N5 node are ensured; the T13 is turned on since the N5 node is in the low level, then the light-emitting control signal output from the outputting terminal EM[n] for the light-emitting control signal is pulled down again at this time, thus a resetting of the light-emitting control signal is achieved.

Figure 5:
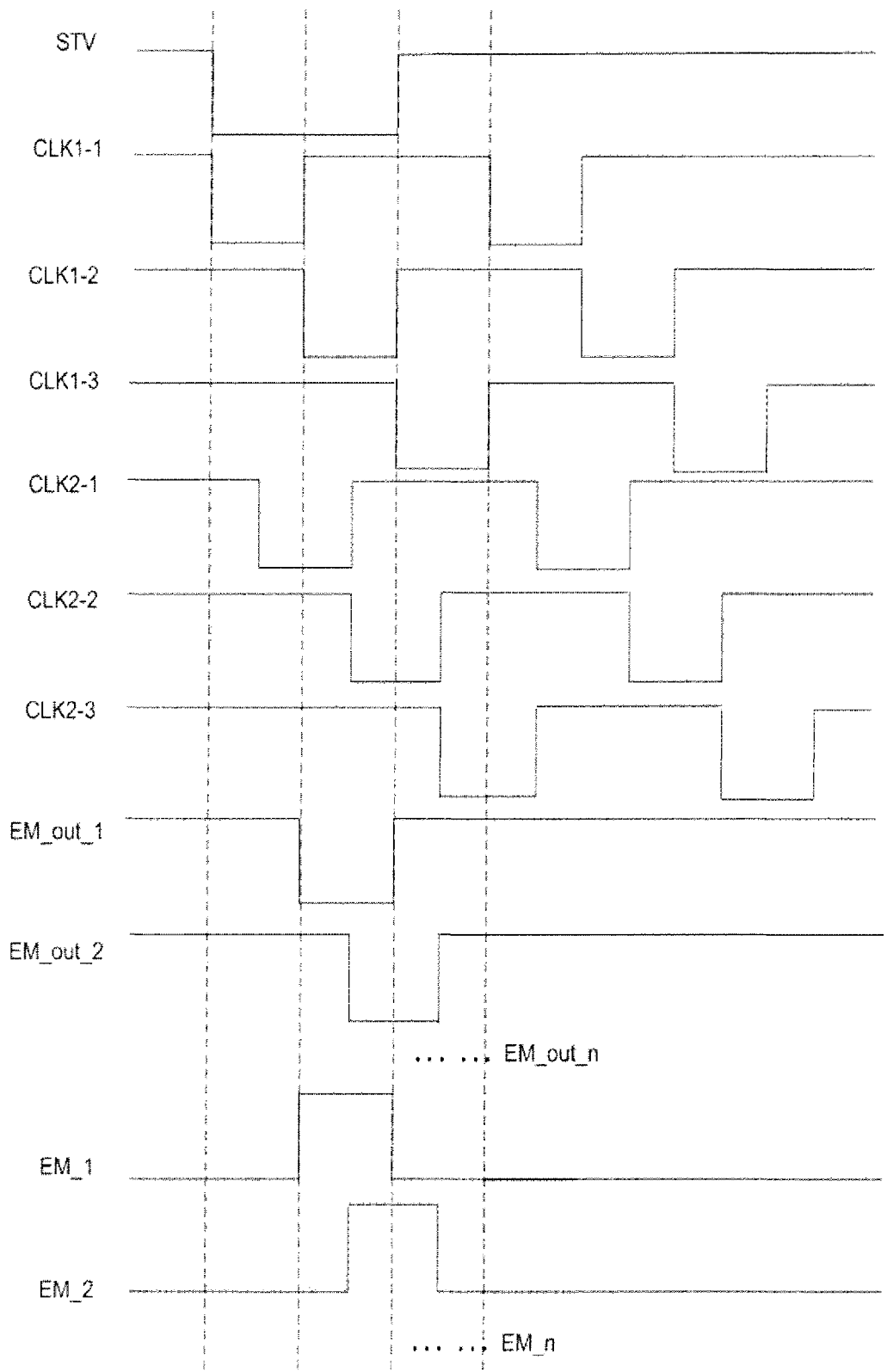
FIG. 5 is a view illustrating an operation timing of the shift register as shown in FIG. 3.

FIG. 5 is a view illustrating an operation timing of the shift register as shown in FIG. 3. In FIG. 5, EM_out_1, EM_out_2, EM_out_n denote an opposite phase outputting terminal of a first light-emitting control circuit stage, an opposite phase outputting terminal of a second light-emitting control circuit stage and an opposite phase outputting terminal of a nth light-emitting control circuit stage, respectively.

EM_1, EM_2, EM_n denote the light-emitting control signal output from the first light-emitting control circuit stage, light-emitting control signal output from the second light-emitting control circuit stage and the light-emitting control signal output from the nth light-emitting control circuit stage, respectively.

Wherein n is an integer being smaller than or equal to a number of stages of the light-emitting control circuits included in the shift register.

A pulse width of CLK1-1, a pulse width of CLK1-2, a pulse width of CLK1-3, a pulse width of CLK2-1, a pulse width of CLK2-2 and a pulse width of CLK2-3 are same.

A pulse width of the start signal STV is twice as the pulse width of CLK1-1, the pulse width of CLK1-2, the pulse width of CLK1-3, the pulse width of CLK2-1, the pulse width of CLK2-2 and the pulse width of CLK2-3, respectively.

A first falling edge of the CLK1-1 aligns with a falling edge of the STV;

a first falling edge of the CLK1-2 aligns with a first rising edge of the CLK1-1;

a first falling edge of the CLK1-3 aligns with a rising edge of the STV;

a first falling edge of the CLK2-1 locates at a ¼ pulse width of the STV, that is, at a ½ pulse width of the CLK1-1 itself;

a first falling edge of the CLK2-2 aligns with a first rising edge of the CLK2-1;

a first falling edge of the CLK2-3 aligns with a first rising edge of the CLK2-2;

a duty ratio of the CLK1-1, a duty ratio of the CLK1-2, a duty ratio of the CLK1-3, a duty ratio of the CLK2-1, a duty ratio of the CLK2-2 and a duty ratio of the CLK2-3 are ⅓.

The embodiments of the present disclosure further provide a light-emitting control method for generating a light-emitting control signal which controls an OLED to emit light in an AMOLED, phases of the light-emitting control signal and a gate driving signal are opposite;

the light-emitting control method comprises steps of:
an input sampling step in which an input sampling unit samples an input signal under a control of a first clock signal and transmits the sampled signal to an outputting terminal for the light-emitting control signal through the output pulling-down unit;

an outputting step in which an outputting unit generates a light-emitting control signal under a control of a second clock signal after the input sampling unit samples the input signal and transmitting the light-emitting control signal to the outputting terminal for the light-emitting control signal; the light-emitting control signal is the turning on signal driving the TFT provided to the OLED device.

a resetting step in which a resetting unit resets the light-emitting control signal through the output pulling-down unit under a control of a third clock signal.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A light-emitting control circuit for generating a light-emitting control signal which controls an OLED to emit light in an AMOLED, phases of the light-emitting control signal and a gate driving signal outputted by a gate driving circuit are opposite;
the light-emitting control circuit comprises an inputting terminal, an input sampling unit, an outputting unit, a resetting unit, an output pulling-down unit and a outputting terminal for the light-emitting control signal, wherein,
the output pulling-down unit is connected with the outputting terminal for the light-emitting control signal;
the input sampling unit is connected with the inputting terminal, a first clock signal inputting terminal and the output pulling-down unit, respectively, and is used for sampling an input signal under a control of a first clock signal and transmitting the sampled signal to the outputting terminal for the light-emitting control signal through the output pulling-down unit;
the outputting unit is connected with the input sampling unit, a second clock signal inputting terminal and the outputting terminal for the light-emitting control signal, respectively, and is used for generating a light-emitting control signal under a control of a second clock signal after the input sampling unit samples the input signal and transmitting the light-emitting control signal to the outputting terminal for the light-emitting control signal;
the resetting unit is connected with a third clock signal inputting terminal and the output pulling-down unit, respectively, and is used for sending a resetting control signal to the output pulling-down unit under a control of a third clock signal;
the output pulling-down unit is used for resetting the light-emitting control signal according to the resetting control signal.

2. The light-emitting control circuit of claim 1, wherein the input sampling unit comprises a first thin film transistor and a second thin film transistor;
a gate of the first thin film transistor is connected with the first clock signal inputting terminal, a source thereof is connected with the outputting unit, and a drain thereof is connected with the inputting terminal;
a gate of the second thin film transistor is connected with the first clock signal inputting terminal, a source thereof is connected with the outputting unit, and a drain thereof is connected with a low level outputting terminal of a driving power supply.

3. The light-emitting control circuit of claim 2, wherein the outputting unit comprises a third thin film transistor, a fourth thin film transistor, a fifth thin film transistor, a sixth thin film transistor, a seventh thin film transistor, a first capacitor and a second capacitor;
a gate of the third thin film transistor is connected with the source of the first thin film transistor, a source thereof is connected with a gate of the fourth thin film transistor, and a drain thereof is connected with the second clock signal inputting terminal;
the gate of the fourth thin film transistor is connected with the source of the third thin film transistor, a source thereof is connected with a gate of the sixth thin film transistor, and a drain thereof is connected with the low level outputting terminal of the driving power supply;
a gate of the fifth thin film transistor is connected with the second clock signal inputting terminal, a source thereof is connected with a high level outputting terminal of the driving power supply, and a drain thereof is connected with the source of the second thin film transistor;
the source of the sixth thin film transistor is connected with the high level outputting terminal of the driving power supply, and a drain thereof is connected with a source of a twelfth thin film transistor;
a gate of the seventh thin film transistor is connected with the second clock signal inputting terminal, a source thereof is connected with the high level outputting terminal of the driving power supply, and a drain thereof is connected with a source of a thirteen thin film transistor;
the first capacitor is connected between the gate and source of the third thin film transistor;
the second capacitor is connected between the gate of the sixth thin film transistor and the low level outputting terminal of the driving power supply.

4. The light-emitting control circuit of claim 3, wherein the resetting unit comprises an eighth thin film transistor and a ninth thin film transistor;
a gate of the eighth thin film transistor is connected with the third clock signal inputting terminal, a source thereof is connected with the high level outputting terminal of the driving power supply, and a drain thereof is connected with the source of the first thin film transistor;
a gate of the ninth thin film transistor is connected with the third clock signal inputting terminal, a source thereof is connected with the source of the second thin film transistor, and a drain thereof is connected with the low level outputting terminal of the driving power supply.

5. The light-emitting control circuit of claim 4, wherein the output pulling-down unit comprises a tenth thin film transistor, an eleventh thin film transistor, the twelfth thin film transistor, the thirteenth thin film transistor, a third capacitor, a fourth capacitor, a fifth capacitor and a sixth capacitor;
a gate of the tenth thin film transistor is connected with a gate of the eleventh thin film transistor, a source thereof is connected with the high level outputting terminal of the driving power supply, and a drain thereof is connected with the source of the third thin film transistor;
a source of the eleventh thin film transistor is connected with the high level outputting terminal of the driving power supply, and a drain thereof is connected with the source of the fourth thin film transistor;
a gate of the twelfth thin film transistor is connected with the source of the second thin film transistor, the source thereof is connected with the drain of the sixth thin film transistor, and a drain thereof is connected with the low level outputting terminal of the driving power supply;
a gate of the thirteenth thin film transistor is connected with the gate of the tenth thin film transistor, a source thereof is connected with the outputting terminal for the light-emitting control signal, and a drain thereof is connected with the low level outputting terminal of the driving power supply;
the third capacitor is connected between the gate and source of the twelfth thin film transistor;
the fourth capacitor is connected the gate and source of the thirteenth thin film transistor;
the fifth capacitor is connected between the gate of the tenth thin film transistor and the low level outputting terminal of the driving power supply;
the sixth capacitor is connected between the outputting terminal for the light-emitting control signal and the low level outputting terminal of the driving power supply.

6. The light-emitting control circuit of claim 5, further comprises an opposite phase outputting terminal;
the gate of the forth thin film transistor is connected with the opposite phase outputting terminal;
a signal output from the opposite phase outputting terminal has an opposite phase to that of the light-emitting control signal.

7. The light-emitting control circuit of claim 6, wherein the first thin film transistor, the second thin film transistor, the third thin film transistor, the fourth thin film transistor, the fifth thin film transistor, the sixth thin film transistor, the seventh thin film transistor, the eighth thin film transistor, the ninth thin film transistor, the tenth thin film transistor, the eleventh thin film transistor, the twelfth thin film transistor and the thirteenth thin film transistor are p-type TFTs.

8. The light-emitting control circuit of claim 5, wherein the first thin film transistor, the second thin film transistor, the third thin film transistor, the fourth thin film transistor, the fifth thin film transistor, the sixth thin film transistor, the seventh thin film transistor, the eighth thin film transistor, the ninth thin film transistor, the tenth thin film transistor, the eleventh thin film transistor, the twelfth thin film transistor and the thirteenth thin film transistor are p-type TFTs.

9. A shift register comprising a plurality of light-emitting control circuit stages of claim 1,
except for the first light-emitting control circuit stage and the second light-emitting control circuit stage, an input signal of the nth light-emitting control circuit stage is a signal having an phase opposite to that of a light-emitting control signal from a (n−2)th light-emitting control circuit stage;
an input signal of the first light-emitting control circuit stage and an input signal of the second light-emitting control circuit stage are a start signal;
n is an integer being greater than 2 and smaller than or equal to N, the N is a number of stages of the light-emitting control circuits included in the shift register.

10. The shift register of claim 9, wherein
the input sampling unit comprises a first thin film transistor and a second thin film transistor;
a gate of the first thin film transistor is connected with the first clock signal inputting terminal, a source thereof is connected with the outputting unit, and a drain thereof is connected with the inputting terminal;
a gate of the second thin film transistor is connected with the first clock signal inputting terminal, a source thereof is connected with the outputting unit, and a drain thereof is connected with a low level outputting terminal of a driving power supply.

11. The shift register of claim 10, wherein
the outputting unit comprises a third thin film transistor, a fourth thin film transistor, a fifth thin film transistor, a sixth thin film transistor, a seventh thin film transistor, a first capacitor and a second capacitor;
a gate of the third thin film transistor is connected with the source of the first thin film transistor, a source thereof is connected with a gate of the fourth thin film transistor, and a drain thereof is connected with the second clock signal inputting terminal;
the gate of the fourth thin film transistor is connected with the source of the third thin film transistor, a source thereof is connected with a gate of the sixth thin film transistor, and a drain thereof is connected with the low level outputting terminal of the driving power supply;
a gate of the fifth thin film transistor is connected with the second clock signal inputting terminal, a source thereof is connected with a high level outputting terminal of the driving power supply, and a drain thereof is connected with the source of the second thin film transistor;
the source of the sixth thin film transistor is connected with the high level outputting terminal of the driving power supply, and a drain thereof is connected with a source of a twelfth thin film transistor;
a gate of the seventh thin film transistor is connected with the second clock signal inputting terminal, a source thereof is connected with the high level outputting terminal of the driving power supply, and a drain thereof is connected with a source of a thirteen thin film transistor;
the first capacitor is connected between the gate and source of the third thin film transistor;
the second capacitor is connected between the gate of the sixth thin film transistor and the low level outputting terminal of the driving power supply.

12. The shift register of claim 11, wherein
the resetting unit comprises an eighth thin film transistor and a ninth thin film transistor;
a gate of the eighth thin film transistor is connected with the third clock signal inputting terminal, a source thereof is connected with the high level outputting terminal of the driving power supply, and a drain thereof is connected with the source of the first thin film transistor;
a gate of the ninth thin film transistor is connected with the third clock signal inputting terminal, a source thereof is connected with the source of the second thin film transistor, and a drain thereof is connected with the low level outputting terminal of the driving power supply.

13. The shift register of claim 12, wherein
the output pulling-down unit comprises a tenth thin film transistor, an eleventh thin film transistor, the twelfth thin film transistor, the thirteenth thin film transistor, a third capacitor, a fourth capacitor, a fifth capacitor and a sixth capacitor;
a gate of the tenth thin film transistor is connected with a gate of the eleventh thin film transistor, a source thereof is connected with the high level outputting terminal of the driving power supply, and a drain thereof is connected with the source of the third thin film transistor;
a source of the eleventh thin film transistor is connected with the high level outputting terminal of the driving power supply, and a drain thereof is connected with the source of the fourth thin film transistor;
a gate of the twelfth thin film transistor is connected with the source of the second thin film transistor, the source thereof is connected with the drain of the sixth thin film transistor, and a drain thereof is connected with the low level outputting terminal of the driving power supply;
a gate of the thirteenth thin film transistor is connected with the gate of the tenth thin film transistor, a source thereof is connected with the outputting terminal for the light-emitting control signal, and a drain thereof is connected with the low level outputting terminal of the driving power supply;
the third capacitor is connected between the gate and source of the twelfth thin film transistor;
the fourth capacitor is connected the gate and source of the thirteenth thin film transistor;
the fifth capacitor is connected between the gate of the tenth thin film transistor and the low level outputting terminal of the driving power supply;
the sixth capacitor is connected between the outputting terminal for the light-emitting control signal and the low level outputting terminal of the driving power supply.

14. The shift register of claim 13, the light-emitting control circuit further comprises an opposite phase outputting terminal;
the gate of the forth thin film transistor is connected with the opposite phase outputting terminal;
a signal output from the opposite phase outputting terminal has an opposite phase to the light-emitting control signal.

15. A light-emitting control method applied to the light-emitting control circuit comprising an inputting terminal, an input sampling unit, an outputting unit, a resetting unit, an output pulling-down unit and a outputting terminal for a light-emitting control signal, for generating a light-emitting control signal which controls an OLED to emit light in an AMOLED, wherein phases of the light-emitting control signal and a gate driving signal outputted by a gate driving circuit are opposite;
the light-emitting control method comprises steps of:
an input sampling step in which a input sampling unit samples an input signal under a control of a first clock signal and transmits the sampled signal to a outputting terminal for the light-emitting control signal through the output pulling-down unit;
an outputting step in which an outputting unit generates a light-emitting control signal under a control of a second clock signal after the input sampling unit samples the input signal and transmitting the light-emitting control signal to the outputting terminal for the light-emitting control signal;
a resetting step in which a resetting unit resets the light-emitting control signal through the output pulling-down unit under a control of a third clock signal.

16. The light-emitting control method of claim 15, wherein
the input sampling unit comprises a first thin film transistor and a second thin film transistor;
a gate of the first thin film transistor is connected with the first clock signal inputting terminal, a source thereof is connected with the outputting unit, and a drain thereof is connected with the inputting terminal;

a gate of the second thin film transistor is connected with the first clock signal inputting terminal, a source thereof is connected with the outputting unit, and a drain thereof is connected with a low level outputting terminal of a driving power supply.

17. The light-emitting control method of claim 16, wherein the outputting unit comprises a third thin film transistor, a fourth thin film transistor, a fifth thin film transistor, a sixth thin film transistor, a seventh thin film transistor, a first capacitor and a second capacitor;

a gate of the third thin film transistor is connected with the source of the first thin film transistor, a source thereof is connected with a gate of the fourth thin film transistor, and a drain thereof is connected with the second clock signal inputting terminal;

the gate of the fourth thin film transistor is connected with the source of the third thin film transistor, a source thereof is connected with a gate of the sixth thin film transistor, and a drain thereof is connected with the low level outputting terminal of the driving power supply;

a gate of the fifth thin film transistor is connected with the second clock signal inputting terminal, a source thereof is connected with a high level outputting terminal of the driving power supply, and a drain thereof is connected with the source of the second thin film transistor;

the source of the sixth thin film transistor is connected with the high level outputting terminal of the driving power supply, and a drain thereof is connected with a source of a twelfth thin film transistor;

a gate of the seventh thin film transistor is connected with the second clock signal inputting terminal, a source thereof is connected with the high level outputting terminal of the driving power supply, and a drain thereof is connected with a source of a thirteen thin film transistor;

the first capacitor is connected between the gate and source of the third thin film transistor;

the second capacitor is connected between the gate of the sixth thin film transistor and the low level outputting terminal of the driving power supply.

18. The light-emitting control method of claim 17, wherein the resetting unit comprises an eighth thin film transistor and a ninth thin film transistor;

a gate of the eighth thin film transistor is connected with the third clock signal inputting terminal, a source thereof is connected with the high level outputting terminal of the driving power supply, and a drain thereof is connected with the source of the first thin film transistor;

a gate of the ninth thin film transistor is connected with the third clock signal inputting terminal, a source thereof is connected with the source of the second thin film transistor, and a drain thereof is connected with the low level outputting terminal of the driving power supply.

19. The light-emitting control method of claim 18, wherein the output pulling-down unit comprises a tenth thin film transistor, an eleventh thin film transistor, the twelfth thin film transistor, the thirteenth thin film transistor, a third capacitor, a fourth capacitor, a fifth capacitor and a sixth capacitor;

a gate of the tenth thin film transistor is connected with a gate of the eleventh thin film transistor, a source thereof is connected with the high level outputting terminal of the driving power supply, and a drain thereof is connected with the source of the third thin film transistor;

a source of the eleventh thin film transistor is connected with the high level outputting terminal of the driving power supply, and a drain thereof is connected with the source of the fourth thin film transistor;

a gate of the twelfth thin film transistor is connected with the source of the second thin film transistor, the source thereof is connected with the drain of the sixth thin film transistor, and a drain thereof is connected with the low level outputting terminal of the driving power supply;

a gate of the thirteenth thin film transistor is connected with the gate of the tenth thin film transistor, a source thereof is connected with the outputting terminal for the light-emitting control signal, and a drain thereof is connected with the low level outputting terminal of the driving power supply;

the third capacitor is connected between the gate and source of the twelfth thin film transistor;

the fourth capacitor is connected the gate and source of the thirteenth thin film transistor;

the fifth capacitor is connected between the gate of the tenth thin film transistor and the low level outputting terminal of the driving power supply;

the sixth capacitor is connected between the outputting terminal for the light-emitting control signal and the low level outputting terminal of the driving power supply.

20. The light-emitting control method of claim 19, the light-emitting control circuit, further comprises an opposite phase outputting terminal;

the gate of the forth thin film transistor is connected with the opposite phase outputting terminal;

a signal output from the opposite phase outputting terminal has an opposite phase to the light-emitting control signal.

* * * * *